United States Patent [19]
Patel et al.

[11] Patent Number: 5,757,706
[45] Date of Patent: May 26, 1998

[54] DYNAMIC LEAKER FOR BIT LINE REFRESH

[75] Inventors: Subeer K. Patel, Santa Clara; Chin-Shu Tan, Folsom, both of Calif.

[73] Assignee: Intel Corporation, Santa Clara, Calif.

[21] Appl. No.: 581,452

[22] Filed: Dec. 29, 1995

[51] Int. Cl.⁶ .................................................. G11C 7/00
[52] U.S. Cl. .................................. 365/203; 365/189.11
[58] Field of Search ................. 365/203, 189.11, 365/226

[56] References Cited

U.S. PATENT DOCUMENTS

| | | |
|---|---|---|
| 4,627,031 | 12/1986 | van Tran .................. 365/203 |
| 5,157,631 | 10/1992 | Shimogawa ............... 365/203 |
| 5,276,646 | 1/1994 | Kim ............................ 365/226 |
| 5,285,416 | 2/1994 | Iokami ....................... 365/203 |
| 5,574,695 | 11/1996 | Suzuki ....................... 365/203 |

*Primary Examiner*—A. Zarabian
*Attorney, Agent, or Firm*—Blakely, Sokoloff, Taylor & Zafman

[57] ABSTRACT

A precharge leaker that removes latent bias charges or signals on bit lines. Latent bias charges removed by the present invention would otherwise slow the divergence of voltages or signals on the bit lines diverge as the data voltages or signals are applied.

19 Claims, 6 Drawing Sheets

DYNAMIC LEAKER FOR BIT LINE REFRESH

FIELD OF THE INVENTION

The present invention relates to the field of memory interfaces; more particularly, the present invention relates to dynamic leakers for bit line refresh.

BACKGROUND OF THE INVENTION

Single bit memory cells are often implemented as a pair of oppositely directed inverters that are connected through a pair of transistors to a pair of bit lines. The input of each inverter is connected to the output of the other inverter, and is also connected to a terminal of one of the transistors such that, when the transistor conducts, data is transferred from the inverters to the pair of bit lines. The transfer is bidirectional, allowing data to be applied to the memory cell during write operations and read from the memory cell during read operations. The gates of the transistors are connected to a common word line signal received from a processor or memory controller. Writing to the memory cell is accomplished by holding the bit lines in a particular state when the word line signal is asserted, thereby allowing the gating transistors to conduct. Reading from the memory cell requires that the voltages previously stored in the memory cell be allowed to alter the voltages on the bit lines.

Referring now to FIG. 1, one embodiment of a RAM memory cell is shown. A pair of opposing inverters 15, coupled to bit lines 14 and 16 via gating transistors 17 and 19, are connected and provide data to the bit lines when the word line signal 18 turns on the transistors 17 and 19.

When a memory is accessed in response to a read operation and its associated memory address, the assertion of a word line causes the transistors to turn on and allow the voltages stored in the memory cell therein to be applied to the bit lines. During a write operation, the bit line voltage is applied to the memory cell. The bit lines are connected to a sense amplifier enabled by a sense amplifier enable signal, received after the word line signal 18 has been asserted. The sense amplifier enable signal, like the word line signal 18, is received from the memory controller (not shown). The sense amplifier detects small differences in voltages between the two bit lines 14 and 16 and provides a sense amplifier output signal indicating which bit line carries the greater voltage. Although configurable, most sense amplifiers cannot respond to voltage differences of less than 100 mV. The sense amplifier output signal is generally at either Vcc or Vss, depending on which of the sense amplifier inputs (bit lines 14 and 16) has the greater voltage. The sense amplifier enable signal is self-timed, meaning that it occurs at a fixed interval after the assertion of the word line signal 18. Therefore, it is critical that the memory cell be able to change the voltage on the bit lines quickly by at least the threshold voltage of the sense amplifier, so that the sense amplifier can detect the difference and provide an output while enabled. However, the speed with which the bit lines themselves respond to the inverters depends on the bit line precharge voltage level when the word line signal 18 is asserted. If a very high voltage appears on the bit lines immediately before the transistors electrically connect the inverters to the bit lines, the voltage on the bit lines may change very slowly and may not be able to achieve the proper differential voltage before the sense amplifier enable signal is withdrawn.

Failure to achieve voltages that allow the proper sense amplifier output signal 34 before the sense amplifier enable signal is deasserted is known as "push out" and is caused by a drift in the voltage of one or both bit lines toward a large latent voltage. Push out is a significant problem in memories that have long intervals of non-use, and can result in the inability to read the values stored in particular memory locations within a short amount of time. Given the voltage levels, it is desirable that the voltage of the bit lines differ from the positive rail voltage (i.e., $V_{cc}$) by approximately the threshold voltage of an NMOS transistor immediately before the word line signal 18 is asserted at the memory cell. It is also desirable that the bit lines be held to voltages equal to one another. If the voltage on the bit lines is too close to either of the rail voltages, then only one bit line will be effected when the word line signal 18 is asserted; if the voltages are, for example, too close to the positive rail voltage (Vcc) when the gating transistors are on, only the inverter that has a low-voltage (Vss) will effect the bit line. The other inverter, carrying a positive voltage at the output, will not affect the voltage of the bit line to which it is connected. Additionally, when a very high voltage appears on either bit line, the response time is far greater, due to the exponential nature of the voltage response. Therefore, it is desirable for both bit lines to be held at approximately one threshold voltage before Vcc until immediately before the word line signal 18 is asserted.

To this end, in many systems a precharge circuit is attached to the bit lines to ensure a constant 1.8 volts is applied to the bit lines. The precharge circuit is disconnected from the bit lines immediately before the word line signal is asserted. A precharge enable signal is applied and quickly removed from the bit lines before either the word line signal or the sense amplifier enable signal is received. However, the voltage applied to the bit lines by the precharge circuit itself drifts upward, toward the positive rail voltage when long periods of time elapse between accesses to the same memory cell. This upward drift imposes an additional delay on the response time of the memory, because more time is needed to drive the bit lines to a difference exceeding 100 mV. The delay (push out) can, in fact, be so great that the sense amplifier enable signal is actually removed before the sense amplifier receives sufficient voltage difference at the bit lines to provide an output, in which case the memory cell simply is not read. Due to the high frequency with which the memory is read, and the consequently brief amount of time the sense amplifier enable signal is asserted, the sense amplifier can fail to identify the correct value in the memory cell. This delay in the response time of the sense amplifier is due strictly to the increase in time to develop enough bit line differential voltage, caused by the upward drift of the precharge voltage. Therefore, it is desirable to remove excess charge from the bit lines after long periods of latency, and to do so before the word line signal or sense amplifier enable signal is received.

Referring now to FIG. 2, a timing diagram showing the operation of a typical memory cell in the prior art is shown. Initially, a precharge circuit applies a precharge voltage to both bit lines 14 and 16. The precharge circuit maintains the bit lines at a constant voltage, one NMOS transistor threshold voltage below Vcc. This voltage is susceptible to a drift towards the positive Vcc voltage, ordinarily 2.7 volts. The precharge circuit detects the assertion of the word line signal 18, received from the microprocessor and indicating an access to memory. The word line signal rises on either a read or a write to the memory. When in a high voltage state, the word line signal 18 the memory cell to the bit lines. The word line signal 18 is asserted on either a read or a write to memory. This electrical connection changes the bit line voltage from the precharge level to a level determined by the value stored in the memory cell. However, if the bit line voltage has previously been biased by a drift in the precharge circuit voltage, the difference between the voltages of the two bit lines will diverge more slowly. This slower bit differential development is caused by the corrupting influence of the biased precharged voltage. While the word line signal is asserted, a sense amplifier enable signal is received from the memory controller. While the sense amplifier enable signal is asserted, a sense amplifier within the memory circuit detects small differences between the two bit lines. Because typical sense amplifiers respond only to voltage differences in excess of the threshold voltage of the sense amplifier, the sense amplifier enable signal must remain asserted for an amount of time no less than the amount of time necessary for the bit lines to accrue a sufficient voltage difference to exceed the threshold voltage of the sense amplifier by more than a predetermined margin. A sense amplifier output signal toggles from a low state to a high state, or from a high state to a low state, when the sense amplifier detects a difference between the two bit lines exceeding the threshold voltage of the sense amplifier. The sense amplifier output signal is amplified when output.

When the word line signal 18 goes high, the voltage difference between the terminals of the memory cell are applied to the bit line 14 and 16 and begin to alter the voltage difference between the bit lines. However, if the precharge circuit has allowed the voltage on the bit lines to drift from one threshold voltage below Vcc to the upper rail voltage, Vcc, the bit lines diverge in voltage more slowly. This causes delays in resolution of the sense amplifier to the correct state. Delays caused specifically because of this drift in the precharge circuit are known as "pushout". As indicated in the final trace in FIG. 2, labeled CAOUT 36, pushout may delay the response in the sense amplifier output signal beyond the falling edge of the sense amplifier enable signal. Because the sense amp enable signal is self timed, a rise in the precharge circuit cannot be used to extend the assertion of this signal. The falling edge of the sense amplifier enable signal cuts off the ability of the memory to provide a sense amplifier output signal to the output. In such a case, the drift in the precharge circuit prevents successful reading the correct value from the memory cell.

Certain methods of removing the voltages from the bit lines using circuit logic, such as dummy-reading, needlessly consume power. Dummy reading discharges the bit lines if they are at a higher than required voltage level. Dummy reads provide a proper voltage on the bit lines, and are completed before the word line signal is received. The assertion of the word line signal, therefore, is applied to the bit lines after the dummy-read has left the bit lines at the proper voltage level. Dummy-reading, however, uses power needlessly, and requires additional logic. Circuit methods, such as applying a 1.8 volt pulse to the bit lines upon every clock cycle when a read operation is not commanded, have proven inefficient, due to the large use of power and the complicated implementation they necessitate. Therefore, an improved method or apparatus to remove excess charge from the bit lines after long periods of latency, and to do so before the word line or sense amplifier enable signal is received, is desirable.

SUMMARY OF THE INVENTION

A leaker device, coupled to bit lines associated with memory cells of a memory system, altering voltage on the bit lines at a predetermined voltage when a precharge voltage circuit is electrically disconnected from the bit lines. The precharge voltage circuit maintains each bit line substantially equal to a first predetermined voltage when the memory cell associated with the bit lines is not being read, but is electrically disconnected from the bit lines before the memory cell is read. After the precharge voltage is electrically disconnected from the bit lines, the leaker device alters the voltage on the bit lines at a second predetermined voltage.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

A dynamic leaker for bit line refresh is described. In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Figure 1:
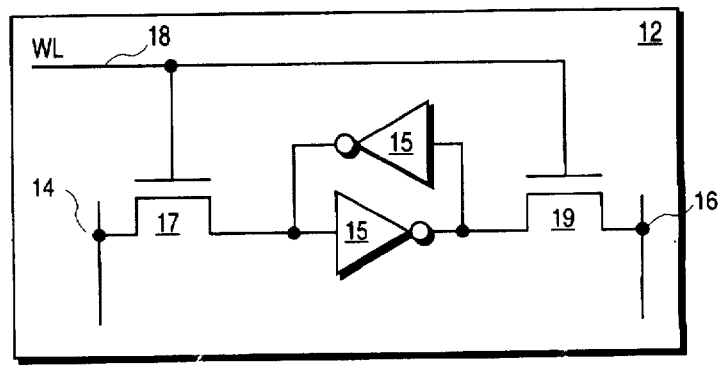
FIG. 1 shows one embodiment of a RAM memory cell.
Figure 2:
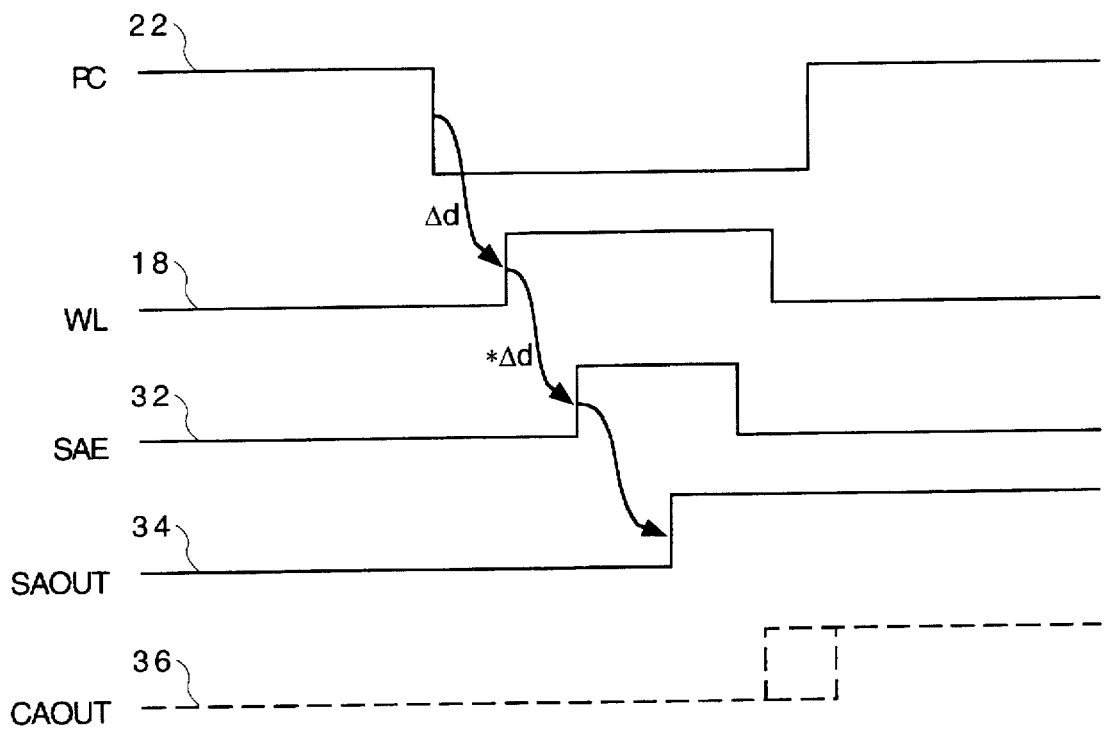
FIG. 2 shows a timing diagram of a prior art memory cell.
Figure 3:
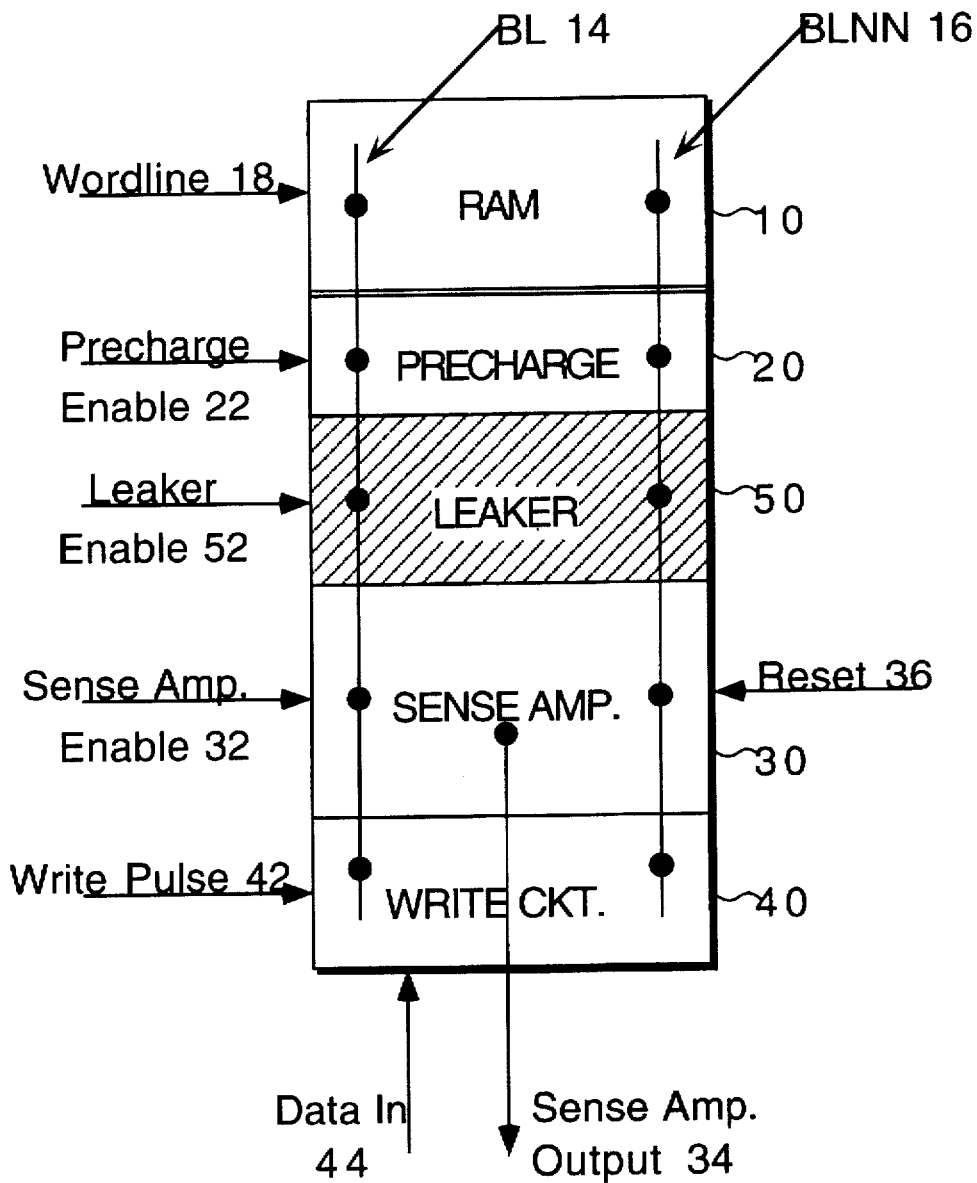
FIG. 3 shows a block diagram of a memory including one embodiment of the present invention.

Referring now to FIG. 3, a block diagram of a memory, with the present invention included is shown. A RAM 10 has a plurality of single bit memory cells located within it, each memory cell associated with a pair of bit lines, identified as BL 14 and BLNN 16. The RAM, such as that shown in detail in FIG. 1, can be read when a word line 18 signal is asserted. The assertion of a signal 18 causes the voltage on the bit lines to be applied to the memory cell, or vice versa. Also shown in FIG. 2 is a precharge element 20. In one embodiment, precharge element 20 comprises an NMOS precharge element. The NMOS precharge element 20 maintains both bit lines at approximately one NMOS threshold voltage below the Vcc power supply voltage applied to the memory when the memory cell is not being accessed. When a precharge enable signal 22 is deasserted, the precharge element is disabled, thereby allowing a subsequent assertion of the word line signal 18 to enable the bit line state to be read onto the bit lines 14 and 16. A differential sense amplifier 30 detects small differences between the voltage of the first bit line 14 and the second bit line 16 and provides a sense amplifier output 34 in response to the difference between the two bit lines 14 and 16. The differential sense amplifier 34 may also be reset by the application of a RESET signal 36. The RESET signal 36 prevents accumulation of charge in the sense amplifier 30 and guarantees a known state of the internal nodes of the sense amplifier 30. Also shown in FIG. 1 is a write circuit 40 that receives a write signal 42. When the write signal 42 is asserted, the write circuit 40 applies a data signal 44 to one of the memory cells within the RAM 10.

Figure 4:
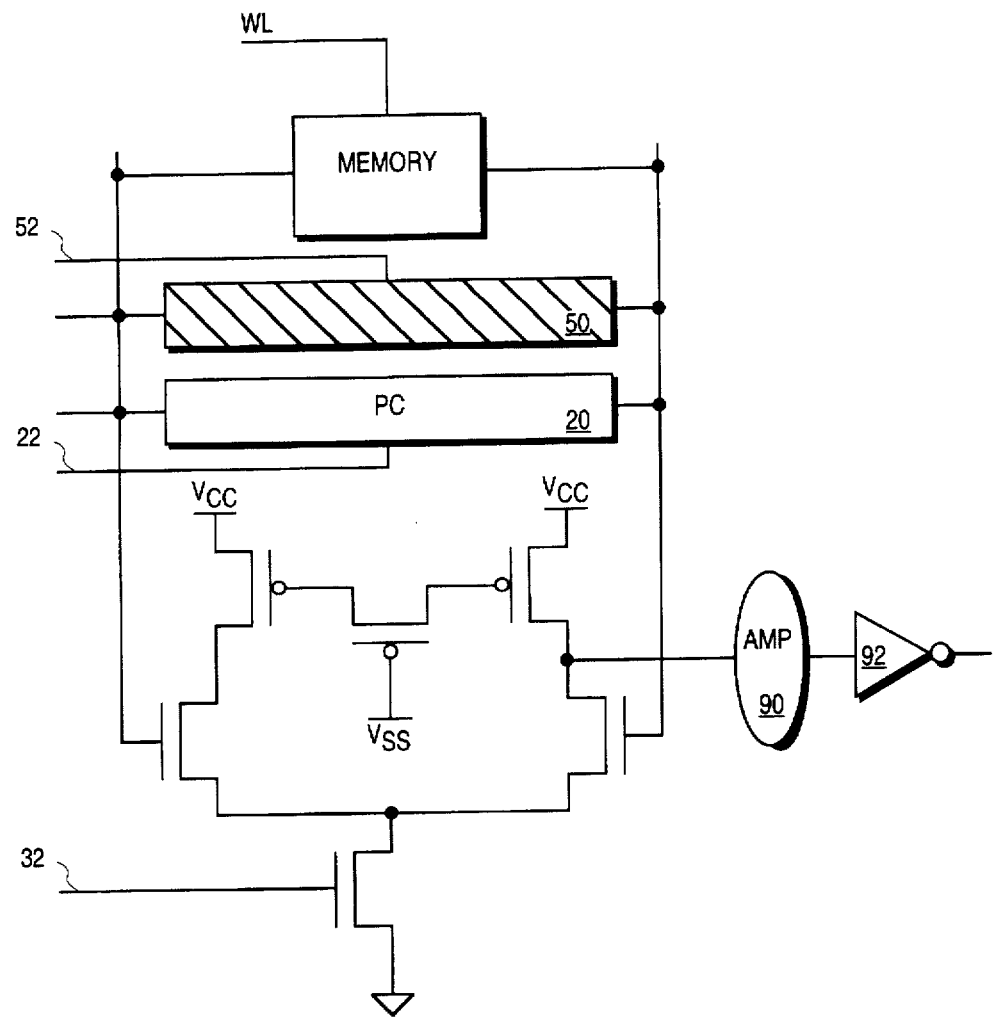
FIG. 4 shows a time diagram of a prior art memory cell.

Referring now to FIG. 4, a memory system including one embodiment of the present invention is shown. A memory cell within RAM 12 receives a word line signal 18 that, when asserted, electrically connects the memory cell to the bit lines 14 and 16. A precharge element 20 connected to the bit lines places a uniform charge on the bit lines that is one NMOS transistor threshold voltage below Vcc. When Vcc is 2.7 volts, the precharge element 20 applies 1.8 volts to both bit lines 14 and 16. This voltage (Vcc) after long periods without access of the memory cell. A leaker device 50 connected to the bit lines, when a leaker enable signal 32 is asserted, removes excess voltage above one threshold voltage below Vcc volts from the bit lines. The leaker enable signal 15 deasserted before the word line 18 or sense amplifier enable signal 32 is asserted.

Figure 5:
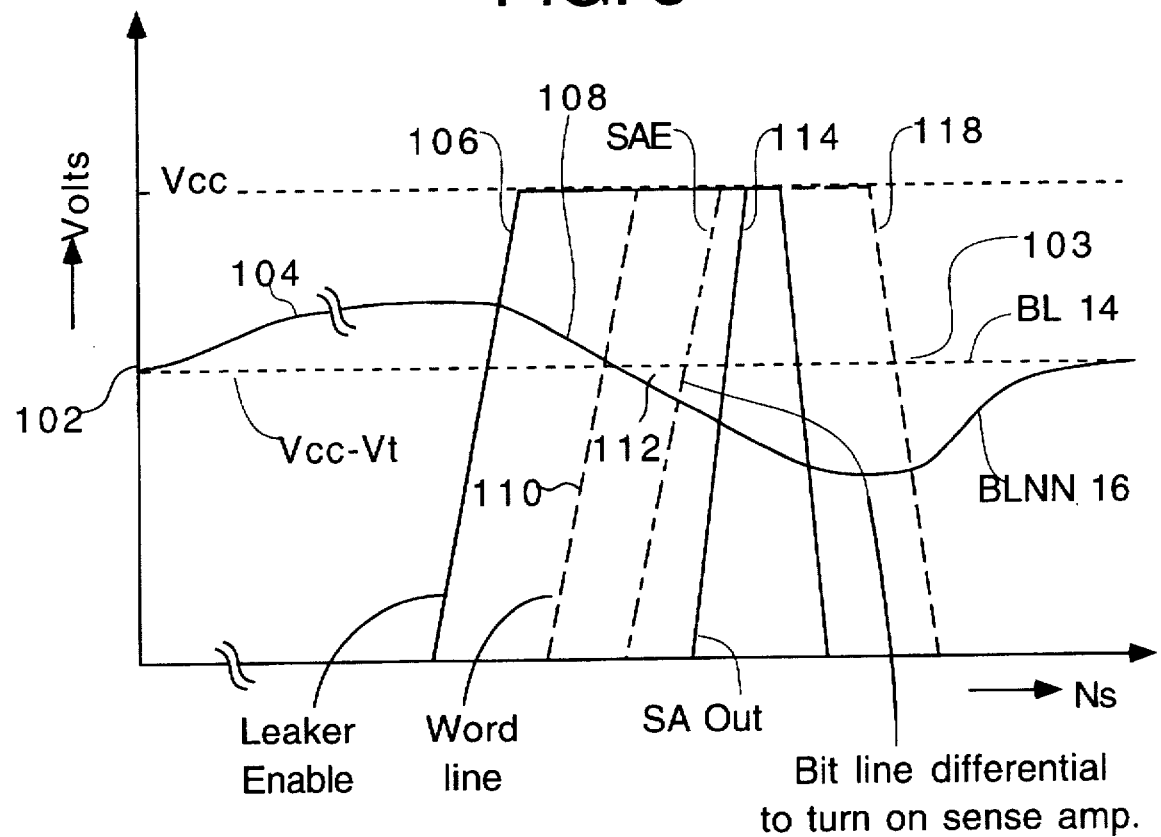
FIG. 5 shows a timing diagram of a circuit including one embodiment of the present invention.

Referring now to FIG. 5, a timing diagram of the circuit implementing one embodiment of the present invention is shown. Initially, a precharge signal is applied to the bit lines, maintaining the bit lines at a constant one threshold voltage below Vcc volts. However, after a period of non-use, such as a power down or halt or other power saving mode of the processor, the precharge circuit may drift to a positive the upper rail voltage, common mode bias. This drift is shown as an increase in the high bit line precharge 104. However, upon receiving a leaker enable signal 106, the leaker device 50 in the present invention draws charge away from the bit lines and reduces the charge on the bit lines 108. When the word line signal 18 is asserted, the charge on the bit lines has been restored to the normal precharge level 110. Because the bit lines have been restored to the normal precharge level, voltage differences between the terminals of the memory cell cause the voltages of the bit lines to diverge at the proper rate. The application of the sense amplifier enable signal 32 occurs at a time sufficiently subsequent to the assertion of the word line signal 18 to ensure that the bit lines diverging in voltage at a normal rate will be at least the threshold voltage of the sense amplifier 30 in difference at some point in time during which the sense amplifier enable signal 32 is asserted 114. Because the bit line differential is sufficient to toggle the output of the sense amplifier 30, an output signal is available when the sense amplifier enable signal 32 returns to its unasserted state. Upon the reassertion of the precharge signal, 118, the voltage difference between the bit lines is removed and the voltage of the two bit lines is restored to the normal precharge value. One such embodiment of the precharge circuit 20 is shown in FIG. 6.

Figure 6:
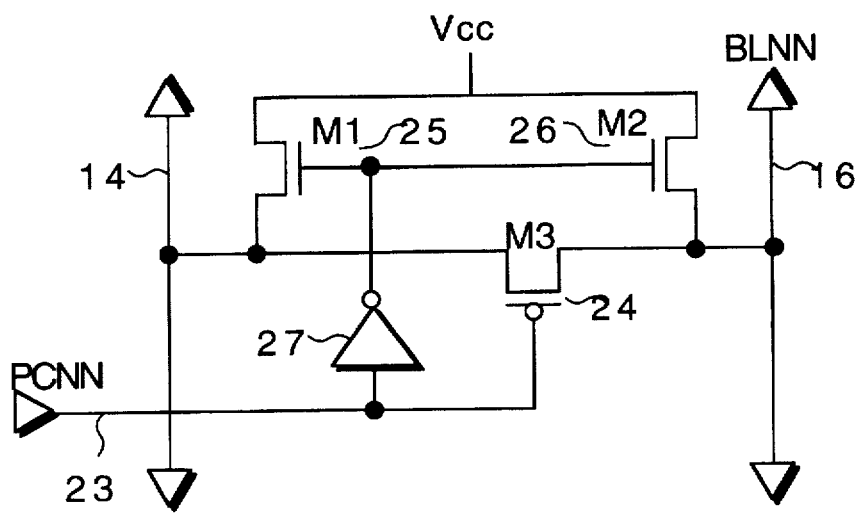
FIG. 6 shows a typical NMOS precharge circuit.

Referring now to FIG. 6, a precharge circuit is shown. A PCNN signal 23, the inverse of the precharge signal 22, is applied both to the gate of a p-channel transistor 24 and to the input of an inverter 27. A positive PCNN signal 23 turns off the transistor 24. Turning off the transistor 24 allows current to flow between the two bit lines, equalizing the voltages between them. Simultaneously, two additional transistors, 25 and 26, are also turned off, allowing the Vcc voltage to be connected directly to the bit lines 14 and 16. Thus, a positive PCNN signal 23 maintains the bit lines at the positive precharge voltage because the precharge enable signal 22 is low (i.e., disabled).

Figure 7:
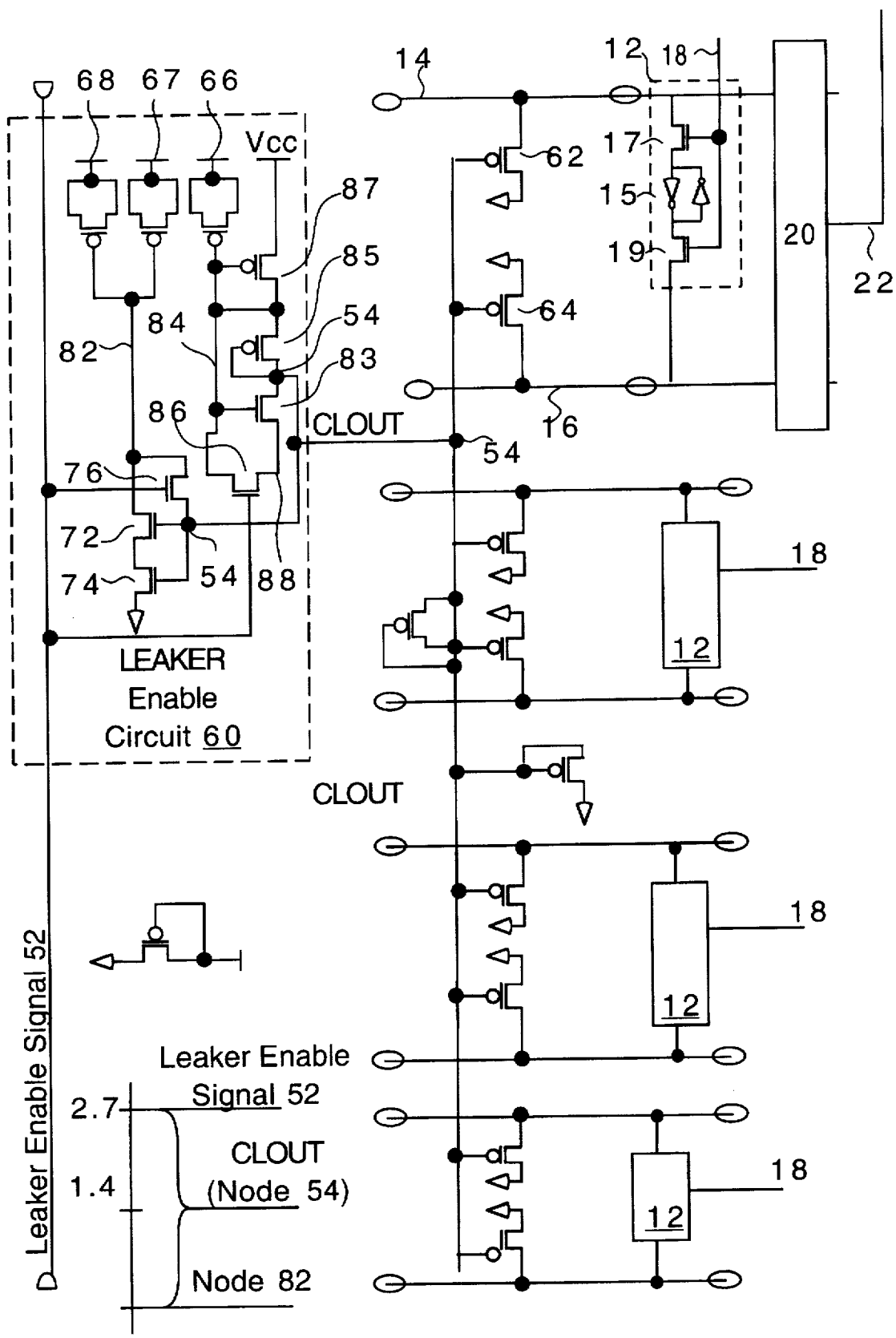
FIG. 7 shows an implementation of an embodiment of the present invention.

Referring now to FIG. 7, one implementation of the present invention is shown. A memory cell within RAM 12 comprising a pair of opposed inverters 15 and a pair of gating transistors 17 and 19, contain a single bit of data. A pair of bit lines 14 and 16 receive signals from the memory cell 12 upon assertion of the word line signal 18. A precharge circuit 20, not shown in FIG. 7, has previously placed a positive bias on the bit lines, causing the voltage of the bit lines to drift to $V_{cc}$, the positive the upper rail voltage. Each bit line is individually and weakly connected to ground by a single transistor 62 or 64, driven by a leaker control output signal CLOUT 54. By maintaining a constant voltage one NMOS threshold voltage below Vcc, the leaker signal CLOUT 54 turns off the transistors 62 and 64 to allow a partial discharge of voltage across the transistors 62 and 64, driving the voltages along the bit lines to the normal precharge level, in case if the bit lines have drifted to voltage higher than normal precharge levels, when the bit lines have drifted to voltages higher than normal precharge levels.

Also shown in FIG. 7 is the leaker enable circuit 60. The leaker enable circuit 60 includes three capacitors 66, 67 and 68 that store positive voltages. Upon receiving the leaker enable signal 52, the leaker enable circuit 60 provides a positive voltage to the gate of a CMOS transistor 72, turning on the transistor. Because the capacitors 67 and 68 maintain positive voltages, the application of a positive voltage at the leaker enable signal 52 allows current to flow from the leaker enable output 54 to the capacitor node 82. Current from the capacitor node 82 then flows through the pair of transistors 72 and 74 to the lower rail terminal $V_{ss}$ (e.g., ground). The triad of transistors, 72, 74 and 76, ensure that the leaker enable output 54 is maintained at a constant level equal to twice the threshold voltage of an NMOS transistor. In this way, the PMOS transistors 62 and 64 receiving a voltage equal to twice the threshold voltage of an NMOS transistor. Should a bit line carry a voltage differing from the leaker enable output 54 by more than the threshold voltage of a PMOS transistor, the transistor 62 or 64 would turn on and discharge the excessive voltage. Thus, the bit lines are maintained at a voltage no greater than $2V_{TN}+V_{TP}$.

If node 54 is at too great a voltage, transistors 72 and 74 turn on; thus, due to the assertion of the leaker enable signal 52, node 54 is reduced to a voltage no greater than $2V_{TN}$. On the other hand, if transistor 87 ensures that node 84 is always within $V_{TP}$ of $V_{CC}$, since the drain and gate are connected and since the source is tied directly to $V_{CC}$. Thus, when the leaker enable signal 52 is asserted, turning transistor 86 on, the voltage of node 88 is approximately equal to the voltage of node 84. Thus, node 88 is maintained within $V_{TP}+V_{TN}$ of $V_{CC}$. Also, the positive voltage on node 84 ensures that transistor 83 is on; thus, because node 88 is at least $V_{CC}-V_{TP}-V_{TN}$ volts, node 54 is maintained at a voltage at least $V_{CC}-V_{TP}-V_{TN}$. In other words, $V_{CC}-V_{TP}-2V_{TN}<V_{54}<2V_{TN}$, where $V_{54}$ is the voltage on node 54.

If either bit line is at a voltage exceeding this $V_{54}$ by more than the threshold voltage of a PMOS transistor, transistor 62 or 64 turns on, at least partially, and "leak" voltage away from the bit lines. Thus, the bit lines cannot have a voltage greater than $2V_{TN}+V_{TP}$ when the leaker is enabled.

Figure 8A:
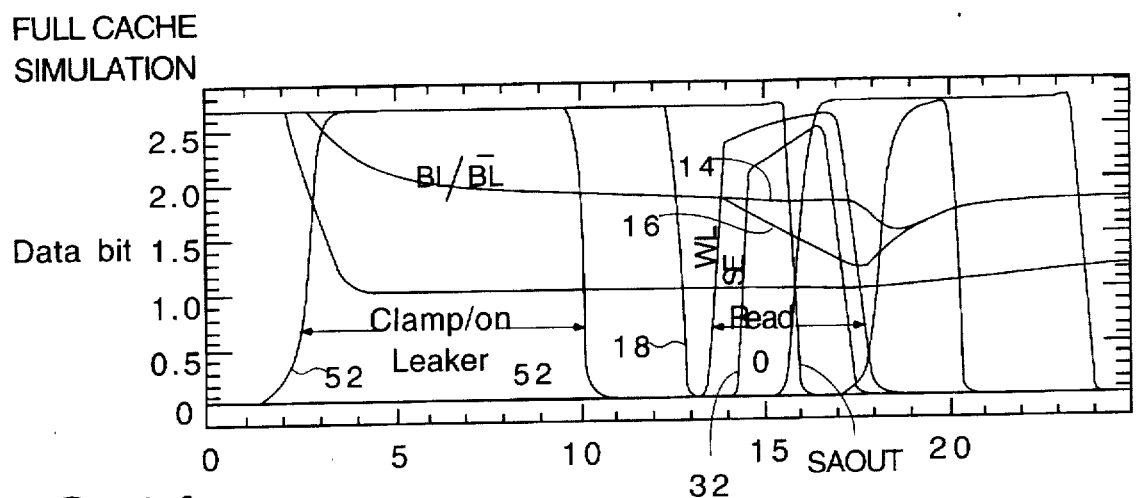
FIGS. 8A, B, and C show a timing diagram of a realized circuit including the present invention.
Figure 8B:
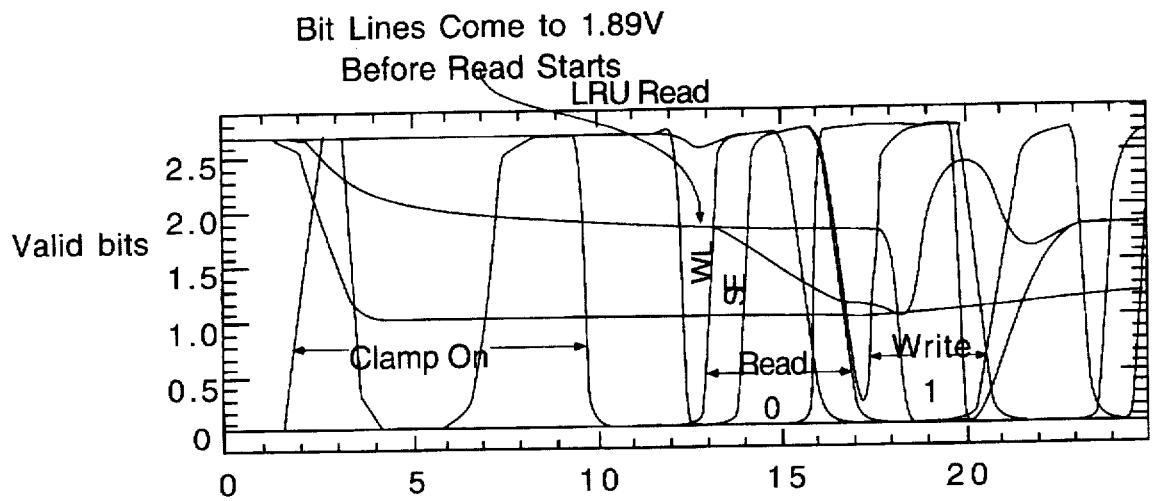
Figure 8C:
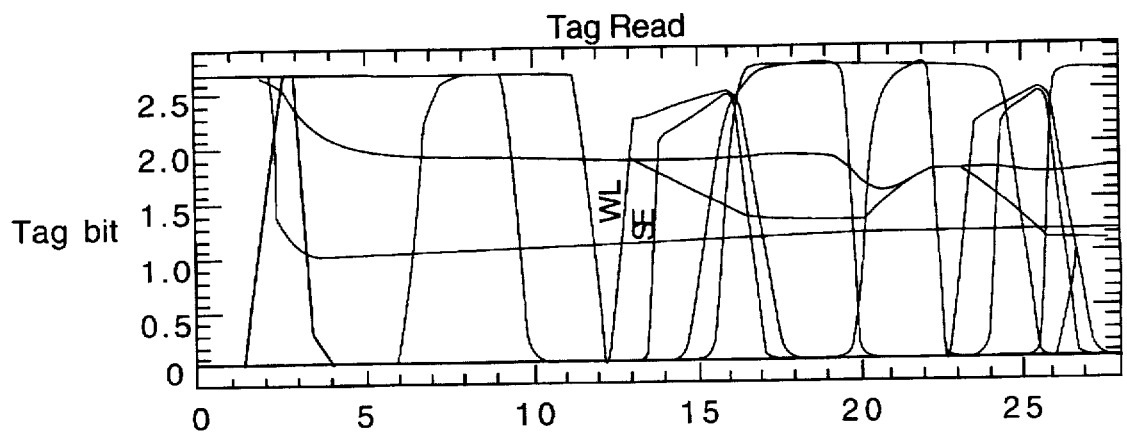

FIGS. 8a, 8b, and 8c illustrate the effect on the voltage of the bit lines for data, valid, and tag bits, respectively. In each case, proper precharge voltage is restored by the present invention. In FIG. 8a, a data bit stored in the memory cell is read by the assertion of a word line signal 18. FIG. 8b illustrates the similar effect on the valid bits, even when a read operation is subsequently followed by a write operation during the same clock cycle. FIG. 8c illustrates the effect on the tag bits, which is virtually identical to the data bit case shown in FIGS. 8a, 8b and 8c can be represented schematically as shown in FIG. 2.

We claim:

1. In a memory system having memory-cells sotring bits of data thereon, a pair of bit lines associated with each memory-cell such that contents from the memory cell are readable onto the bit lines, a precharage voltage circuit maintaining each bit line substantially equal to a first predetermined voltage when the memory cell associated therewith is not being read, said precharge voltage circuit being electrically disconnected from the bit lines associated with a particular memory cell before the memory cell is read onto said bit lines, an improvement comprising:

a leaker device, coupled to the bit lines, altering voltage on the bit lines to a second predetermined voltage when the precharge voltage circuit is electrically disconnected from the bit lines.

2. The improvement as set forth in claim 1, wherein the precharge voltage circuit accumulates a common mode bias voltage on the bit lines, and the leaker device removes the common mode bias voltage from the bit lines.

3. The improvement as set forth in claim 1, wherein the leaker device applies the second predetermined voltage to the bit lines in response to a leaker enable signal being asserted.

4. The improvement as set forth in claim 3, wherein the leaker device comprises:

a leaker enable circuit providing the second predetermined voltage when the leaker enable signal is asserted, and a leaker circuit, receiving the second predetermined voltage and applying the second predetermined voltage to the bit lines.

5. The improvement as set forth in claim 1, wherein the leaker device is responsive to a leaker enable signal; and the second predetermined voltage is determined such that altering the voltages on the bit lines, from a first line state in which both bit lines have substantially the second predetermined voltage to a second line state in which the bit lines differ by at least the threshold voltage of a differential amplifier coupled to the bit lines, is accomplished in less time than a delay between disabling the leaker device and enabling the differential amplifier.

6. A method of reading memory cells storing bits of data thereon, each of the memory cells individually coupled to a pair of bit lines, the method comprising the steps of:

applying a precharge voltage to each bit line to maintain each bit line substantially equal to a first predetermined voltage when the memory cell associated therewith is not being read;

electrically disconnecting the precharge voltage from the bit lines associated with a particular memory cell before the memory cell is read onto said bit lines; and maintaining the voltage on the bitlines at a predetermined voltage instead of the precharge voltage when the precharge voltage is electrically disconnected from the bit lines.

7. The method as set forth in claim 6, wherein the step of maintaining comprises removing a common mode bias voltage from the bit lines.

8. The method as set forth in claim 6, wherein the step of maintaining further comprises:

receiving a leaker enable signal, and applying the predetermined voltage to the bit lines in response to the leaker enable signal.

9. The method as set forth in claim 6, further comprising the step of:

providing an output signal in a first output state when a difference in voltage between the two bit lines is less than a predetermined threshold voltage, and in a second output state when the difference in voltage between the two bit lines is more than the predetermined threshold voltage.

10. The method as set forth in claim 6, further comprising the steps of:

receiving an enable signal; and providing an output signal, the output signal being in a first output state when the enable signal is asserted and the difference in voltage between the two bit lines is less than a predetermined threshold voltage, and the output signal being in a second output state when the enable signal is asserted and the difference in voltage between the two bit lines is more than the predetermined threshold voltage.

11. A method as set forth in claim 10, further comprising the steps of:

predetermining a predetermined voltage, determined such that altering the voltages on the bit lines, from a first line state in which both bit lines have substantially the predetermined voltage to a second line state in which the bit lines differ by at least the threshold voltage of a differential amplifier, is accomplished in less time than the delay between the deassertion of the enable signal and the assertion of the differential amplifier enable signal.

12. A leaker device as set forth in claim 11, further comprising the steps of:

applying the voltage of the memory cell to the bit lines, after deasserting the leaker enable signal and prior to asserting the differential amplifier enable signal.

13. In a memory system having memory-cells storing bits of data thereon, a pair of bit lines associated with each memory-cell such that contents from the memory cell are readable onto the bit lines, a precharge voltage circuit maintaining each bit line substantially equal to a first predetermined voltage when the memory cell associated therewith is not being read, said precharge voltage circuit being electrically disconnected from the bit lines associated with a particular memory cell before the memory cell is read onto said bit lines, an improvement comprising:

a leaker device means, coupled to the bit lines, altering the voltage on the bit lines at a second predetermined voltage when the precharge voltage circuit is electrically disconnected from the bit lines.

14. The improvement set forth in claim 13 wherein the precharge voltage circuit accumulates a common mode bias voltage on the bit lines, and the leaker device means removes the common mode bias voltage from the bit lines.

15. The improvement set forth in claim 13, wherein the leaker device means applies the second predetermined voltage to the bit lines in response to a leaker enable signal being asserted.

16. The improvement set forth in claim 15, wherein the leaker device means comprises:

a leaker enable means providing the second predetermined voltage when the leaker enable signal is asserted, and a leaker circuit means, receiving the second predetermined voltage and applying the second predetermined voltage to the bit lines.

17. The improvement set forth in claim 13, wherein the leaker device means is responsive to a leaker enable signal; and the second predetermined voltage is determined such that altering the voltages on the bit lines, from a first line state in which both bit lines have substantially the second predetermined voltage to a second line state in which the bit lines differ by at least the threshold voltage of a sense determination means coupled to the bit lines, is accomplished in less time than delay between disabling the leaker and the enabling of the sense determination means enable signal.

18. A memory means, having a memory means storing bits of data therein, and further having a communication means coupling said memory means with a processor means, comprising:

precharge means, providing a predetermined first signal to the communication means;

control means, detecting deviations in the first signal;

correction means, removing deviations in the first signal;

means for coupling memory means to said communication means after said correction.

19. A method of providing data from a memory to a processor, comprising the steps of:

predetermining a first signal to a bus line;

applying a signal substantially equivalent to said first signal to said bus line;

determining any difference between the applied signal and the predetermined signal;

adding or removing said difference, to correct the first signal; and applying a second signal determined by a memory to said bus line.

* * * * *